United States Patent [19]
Engel et al.

[11] Patent Number: 5,544,065
[45] Date of Patent: Aug. 6, 1996

[54] APPARATUS FOR DIGITIZING AC SIGNALS OF UNKNOWN OR CHANGING FREQUENCY

[75] Inventors: Joseph C. Engel, Monroeville; Thomas J. Kenny, Pittsburgh, both of Pa.

[73] Assignee: Eaton Corporation, Cleveland, Ohio

[21] Appl. No.: 287,972

[22] Filed: Aug. 9, 1994

[51] Int. Cl.⁶ .......................... G01R 23/10; H03M 1/00
[52] U.S. Cl. .......................... 364/484; 364/487; 341/123
[58] Field of Search .................................. 364/484, 487; 341/122, 123, 157; 307/27, 64, 65, 66, 84, 85, 86, 87; 327/184

[56] References Cited

U.S. PATENT DOCUMENTS

| | | | |
|---|---|---|---|
| 4,291,299 | 9/1981 | Hinz et al. | 341/123 |
| 4,370,643 | 1/1983 | Kitamura | 341/123 |
| 4,393,371 | 7/1983 | Morgan-Smith | 341/123 |
| 4,625,283 | 11/1986 | Hurley | 364/487 |
| 4,633,222 | 12/1986 | Dingwall | 341/122 |
| 4,672,227 | 6/1987 | Lagree et al. | 307/64 |
| 4,685,614 | 8/1987 | Levine | 341/157 |
| 4,747,061 | 5/1988 | Lagree et al. | 364/483 |
| 4,788,646 | 11/1988 | Herzl | 364/484 |
| 4,799,165 | 1/1989 | Hollister et al. | 364/487 |
| 4,837,705 | 6/1989 | Mussler et al. | 364/484 |
| 4,841,451 | 6/1989 | Rumpf et al. | 364/484 |
| 4,894,796 | 1/1990 | Engel et al. | 364/900 |
| 4,996,474 | 2/1991 | Tambe et al. | 364/484 |
| 5,070,333 | 12/1991 | Marschall | 341/157 |
| 5,224,054 | 6/1993 | Wallis | 364/483 |
| 5,229,651 | 7/1993 | Baxter, Jr. et al. | 364/487 |
| 5,233,538 | 8/1993 | Wallis | 364/483 |
| 5,243,343 | 9/1993 | Moriyasu | 341/123 |
| 5,260,705 | 11/1993 | Inukai | 341/123 |
| 5,270,898 | 12/1993 | Elms et al. | 361/96 |

*Primary Examiner*—Emanuel T. Voeltz
*Assistant Examiner*—Eric W. Stamber
*Attorney, Agent, or Firm*—Martin J. Moran

[57] ABSTRACT

The frequency and sampling interval for synchronous sampling of an ac signal of unknown or varying frequency are accurately determined within one cycle by apparatus including an input circuit which generates a single input pulse for each cycle of the ac signal. The count of clock pulses maintained by a free running counter is recorded at each input pulse. The frequency of the ac signal is determined from the period of the ac signal calculated from the difference in the count stored at consecutive input pulses. This difference in the count is divided by the desired sampling rate to generate the sampling count which is repetitively added to the current running count to generate an interrupt count. A sampling interrupt utilized by an analog to digital converter to digitize the ac signal is generated when the running count equals the interrupt count. The same sampling interval is used for each phase of a multiphase signal; however, a separate sampling interval is established for each ac signal in a multisignal system.

9 Claims, 6 Drawing Sheets

5,544,065

APPARATUS FOR DIGITIZING AC SIGNALS OF UNKNOWN OR CHANGING FREQUENCY

BACKGROUND OF THE INVENTION

1. Field of the Invention

The present invention relates to apparatus for generating a digital representation of an analog ac waveform, and more particularly to apparatus for generating a selected number of samples per cycle of ac waveforms of unknown or changing frequency.

2. Background of Information

Digital equipment which monitors and controls ac signals, require that the ac signals be digitized for use by the digital circuitry. In systems in which it can be assumed that the frequency of the ac signal remains constant, the signal is digitized by sampling the ac signal at fixed intervals of time. In some applications, it can not be assumed that the frequency remains constant. Typically in such cases, the frequency is periodically calculated by counting the number of zero crossings of the ac signal within a given time period. In some applications, the sampling interval is adjusted to accommodate for the change in frequency so that a common number of digitizing samples is taken per cycle of the ac waveform despite changes in the frequency. In other cases, the sampling interval remains fixed, and an accommodation is made in the software for the change in the number of samples per cycle resulting from a change in frequency. In U.S. patent applications Ser. No. 08/072,376 filed on Jun. 7, 1993, now U.S. Pat. No. 5,343,174 and 08/249,829 filed on May 26, 1994, the number of zero crossings in a time period set by a predetermined number of samples is used to determine whether a circuit interrupter is connected to a 50 Hz or 60 Hz source, and the appropriate fixed sampling interval for synchronously sampling at the appropriate frequency is selected. In this situation, it is accepted that the frequency of the connected signal is either 50 Hz or 60 Hz, and the time utilized to make the determination is not critical, as it is assumed that the source frequency is stable. In the exemplary embodiments of these systems, the number of zero crossings in about 1 second is used to determine the frequency for setting the sampling rate to one of two fixed values.

One application in which there can be a wide variation in the frequency of an ac signal is in transfer switches which control connection of a load to alternative power sources. In many cases, one of the alternative power sources is an emergency source powered by an internal combustion engine. The frequency of such a source will vary until rotational speed of the generator stabilizes, and even, then may wander about a nominal value. The transfer switch monitors this frequency, to make sure that the source that is connected to the load is within prescribed frequency limits. Even where the alternative power sources controlled by a transfer switch are both commercial sources, the transfer switch must monitor the frequencies to assure that they are within limits.

In applications where the frequency of the source varies, or the frequencies of multiple sources must be monitored, there is a need for a system for rapidly and accurately determining the frequency. There is a further need in such applications for a system which accurately and rapidly adjust the sampling rate, particularly where synchronous sampling is desired.

SUMMARY OF THE INVENTION

These and other needs are satisfied by the invention which is directed to apparatus for digitizing an ac signal of unknown or changing frequency. This apparatus in accordance with the invention includes input circuit means which generates an input pulse for each cycle of the ac signal. Clock signal generating means generates a clock signal comprising clock pulses. A counter means generates a running count of the clock pulses. Digital means has means responsive to the input circuit means for determining a difference count of clock pulses counted by the counter means between first and second selected input pulses. Sampling count generating means divides the difference count by a sampling factor selected to produce a desired number of samples of the ac signal to be taken per cycle to generate a sampling count. Preferably, the difference count is generated for the counts at consecutive input pulses, and hence the difference count is divided by the desired integer number of samples per cycles. The sampling interrupt generating means generates a sampling interrupt signal for each sampling count of clock pulses. The sampling interrupt signal is used by an analog-to-digital (A/D) converter to generate digital samples of the ac signal in response to each sampling interrupt signal. Where an ac signal is multi-phase, the sampling interval is used by the A/D converter to sequentially digitize each phase before the frequency and sampling interval are again calculated.

The invention has particular application to apparatus which monitors and/or controls multiple ac signals any of which may be multi-phase. In this instance, the frequency and sampling interval are calculated separately for each of the ac signals. The sampling interval calculated for each of the multiple signals is immediately used to digitize each phase of that signal before the frequency and sampling interval for the next signal are calculated.

In accordance with the invention, the frequency and precise timing interval for synchronous sampling is determined within one cycle. Hence, the invention is particularly suitable for applications where the frequency of the ac signals is varying or where there are multiple signals which are alternatively sampled and may have different frequencies.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENT

The invention will be described as applied to a transfer switch utilized in an electrical system to provide alternative sources of electric power to a load. It will be realized by those skilled in the art; however, that the invention has application to various kinds of electrical apparatus in which analog ac waveforms are digitized for input to digital circuitry. In particular, the invention has application to, but is not limited to, electrical apparatus such as circuit breakers, contactors, motor starters, motor controllers and electrical meters in addition to transfer switches. It has particular application to such apparatus where it is desired to sample the ac waveform at an integer number of samples per cycle yet the frequency of the ac signal is unknown or varies. Thus, the invention has particular application to the transfer switch which controls connection of alternative power sources to a load, and wherein at least one of the sources can be an emergency power unit which must be brought up to rotating speed to generate the desired frequency of ac power, and wherein the frequency of the power generated can vary with engine speed.

Figure 1:
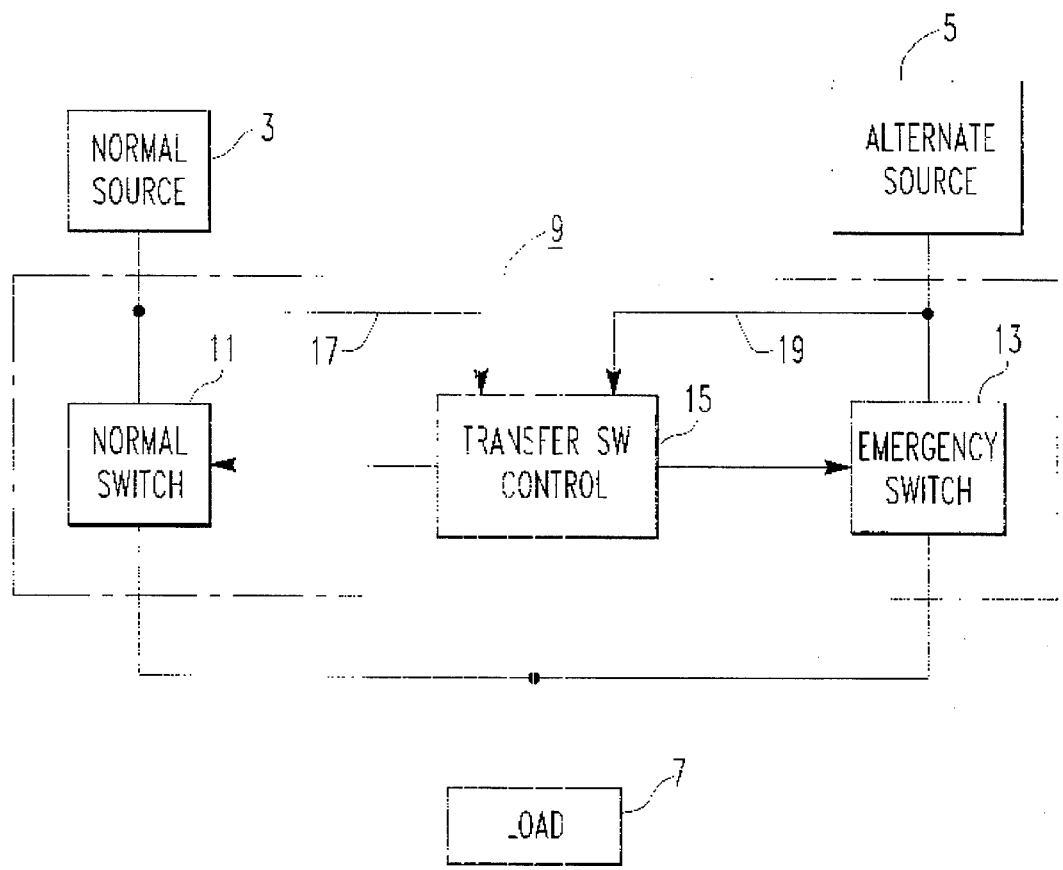
FIG. 1 is a schematic diagram in block form a prior art transfer switch to which the invention has been applied.

FIG. 1 illustrates an electrical system 1 in which electric power from a normal source 3 or from an emergency source 5 is provided to a load 7. The normal source 3 and the alternate source 5 can each be commercial power sources, or can each be self-contained electrical generators driven by prime movers, or the normal source can be a commercial power source and the alternate power source 5 can be an emergency power source in the form of a self-contained generator.

In any case, a transfer switch 9 controls connection of the load 7 to one of the power sources. The transfer switch 9 includes a normal switch 11 which connects the normal source to the load 7, and an alternate switch 13 which connects the alternate source 5 to the load 7. The switches 11 and 13 may be circuit breakers or can be switches without protection functions. The switches 11 and 13 are controlled by a transfer switch control 15. The transfer switch control 15 monitors the voltages generated by the normal source 3 and the alternate source 5 over the leads 17 and 19 respectively. The electrical system 1 can be a single phase system or multi-phase system.

The transfer switch control 15 typically connects the load 7 to a preferred source, normally the normal source 3. If a failure is detected in the normal source, or on demand or in response to a program, the load 7 can be switched to the alternate source 5. Before making such a transfer, the transfer switch control 15 makes sure that the alternate source is ready to power the load. In some applications, the transfer switch control 15 continues to monitor the normal source 3 while the alternate source 5 is connected to the load 7, and automatically transfers back to the normal source 3 when the normal source returns to normal operation. Examples of transfer switches are shown for instance in U.S. Pat. Nos. 4,672,227; 4,747,061; and 4,894,796.

The transfer switch control 15 incorporates digital circuitry to perform its various functions. The normal and alternate source voltages on the leads 17 and 19 must be digitized for use by the transfer switch control 15. In order to rapidly generate accurate digital representations of the analog voltage signals, the transfer switch control 15 digitizes the analog signals at an integer number of samples per cycle. As mentioned above, however, the frequency of the two signals can be different, and the frequency of the individual signals can even vary, especially that of the alternate power source 5 when it is a self-contained generator with a prime mover which must be started and brought up to speed.

Figure 2:
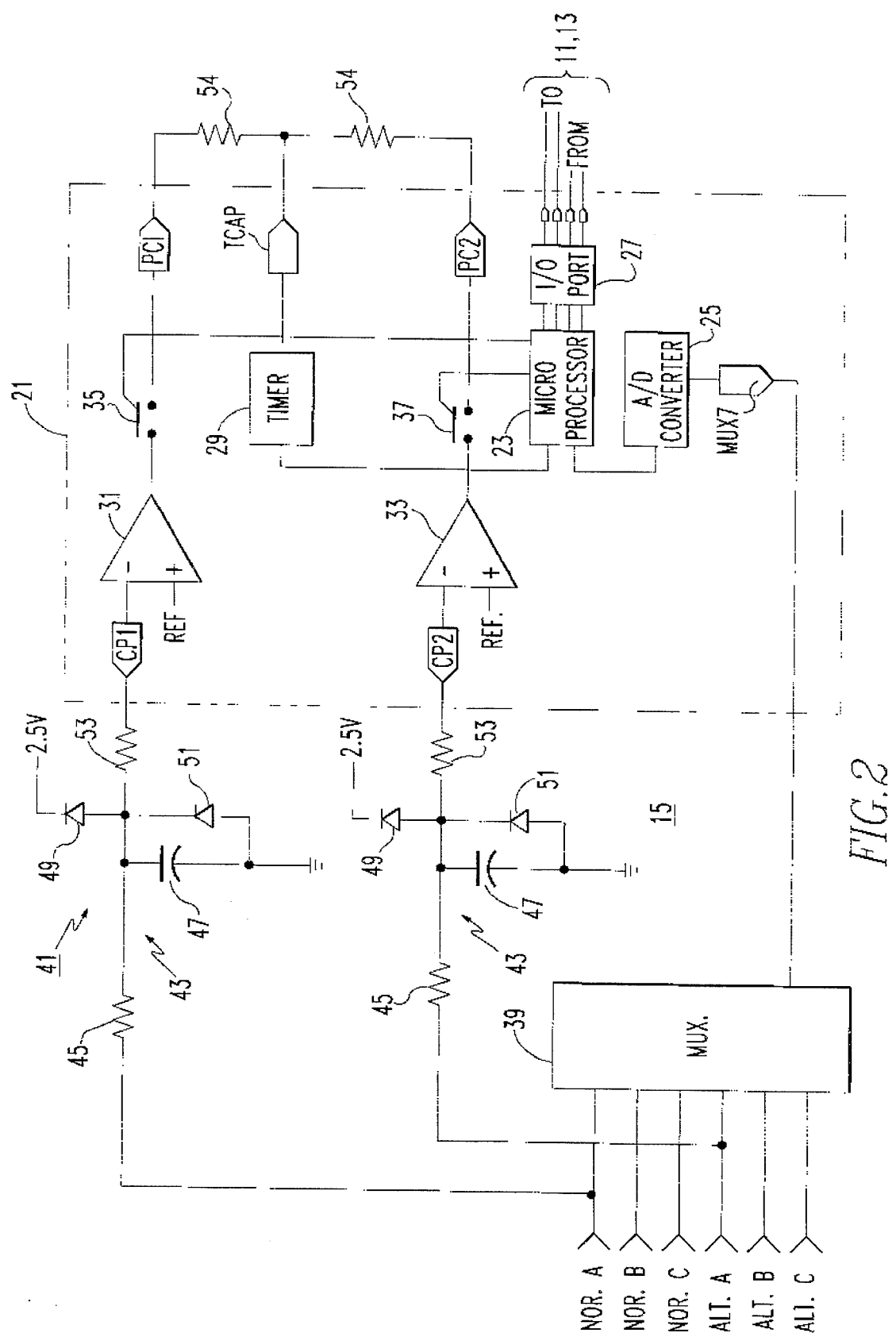
FIG. 2 is a schematic diagram, partially in block diagram form, of the transfer switch control which forms part of the transfer switch of FIG. 1.

FIG. 2 is a schematic diagram of the transfer switch control 15. The transfer switch control 15 utilizes a custom integrated circuit chip 21. The construction and operation of this integrated circuit chip is disclosed in U.S. Pat. No. 5,270,898 which is hereby incorporated by reference. This integrated circuit (IC) is a monolithic IC fabricated in CMOS technology and standardized for controlling various types of electrical equipment, such as circuit breakers, motor controllers, contactors, transfer switches and the like. The IC 21 includes an on-board microprocessor 23, an analog to digital (A/D) subsystem 25, and various input/output devices including I/O port 27. The IC 21 further includes a timer 29 which is described in connection with FIG. 3, and on-board comparators 31 and 33 which may be selectively connected to the timer 29 by switches 35 and 37, respectively.

The three phase voltages from the normal source 3 and from the alternate source 5 are applied to a multiplexer 39 which sequentially applies them to the A/D converter 25 which in mm digitizes them in a manner to be discussed for input to the microprocessor 23. The phase A voltages of the normal source 3 and alternate source 5 are also applied to an input circuit 41. The input circuit 41 includes input filters 43 each comprising a resistor 45 and capacitor 47 which filter out any noise in the phase A voltages so that essentially the fundamental frequency remains. The filtered phase A voltage of the normal source is clipped by diodes 49 and 51 and applied through an input resistor 53 to the comparator 31 where it is compared to a reference voltage, REF. The diodes 49 and 51 and comparator 31 produce a square wave having a frequency equal to the fundamental frequency of the normal source phase A voltage. The resultant square wave is phase shifted relative to the phase A voltage due to the large input filter 43; however, the exact instants of the zero crossings of the phase A voltage are not required, only the interval of time between zero crossings is needed and this can be determined from the square wave signal.

Similarly, the filtered phase A voltage of the alternate source 5 is shaped by clipping diodes 49 and 51 and comparator 33 to generate a square wave having the fundamental frequency of the phase A voltage of the alternate source. As will be discussed, the microprocessor 23 controls the switches 35 and 37 to alternately apply the squared phase A voltage of the normal source 3 and the alternate source 5 to the timer 29 through a resistor 54. As will be seen, the timer 29 rapidly and accurately sets the timing interval for sampling of the voltages of the normal and alternate sources by the A/D converter 25. The digitized source voltages are utilized by the microprocessor 23 to generate signals for controlling the normal switch 11 and emergency switch 13. Commands for operation of the switches 11 and 13 are output through the I/O port 27. Status signals indicating whether the switches 11 and 13 are opened or closed are received through the I/O port 27.

Figure 3:
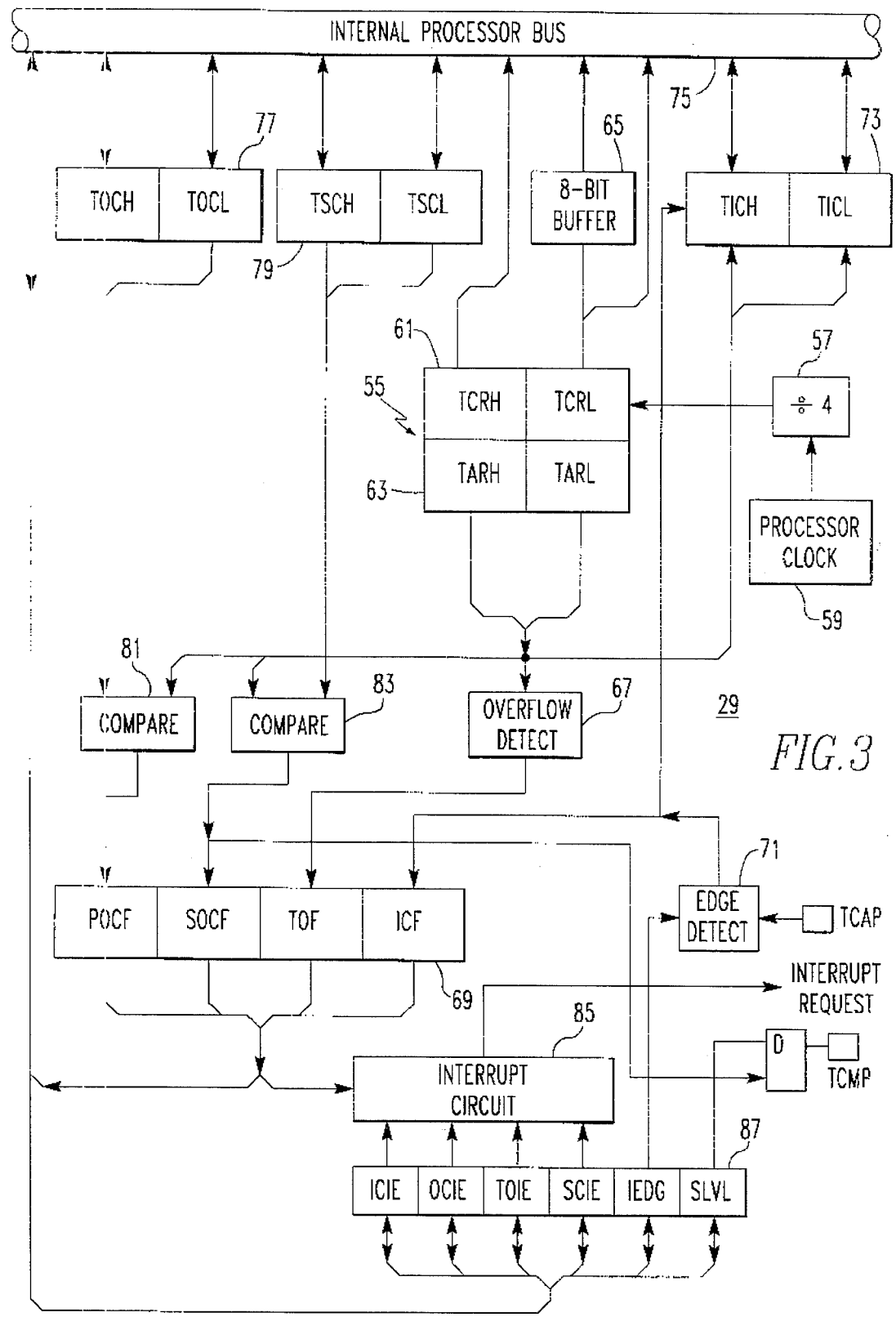
FIG. 3 is a schematic diagram of a timer which forms part of the transfer switch shown in FIG. 2.

The timer 29 is illustrated in FIG. 3. The details of the full operation of this timer are disclosed in U.S. No. Pat. 5,270,898 which has been incorporated by reference herein. Hence, only the aspects of operation of the timer pertinent to the present invention will be discussed.

The key element of the programmable timer 29 is a 16-bit free running counter 55 fed by a prescaler 57 which divides the microcontroller internal phase II clock 59 by four. The prescaler 57 gives the timer a resolution of 2.00 μs, assuming a crystal frequency of 4 MHz. The counter 55 is clocked to increasing values during the low portion of the internal phase II clock. Because the timer has a 16-bit architecture, each specific functional capability is represented by two registers. These registers contain the high and low byte of that function. Generally, accessing the low byte of a specific timer function allows full control of that function; however, access of the high byte inhibits that specific timer function until the low byte is also accessed. The double byte free running counter 55 can be read from either of two locations: The counter register 61 having a high byte (TCRH, and a low byte TCRL) or an alternate counter register 63 (TARH, TARL). A read sequence containing only a read of a least significant byte of the counter register will receive the counter value at the time of the read. If the read of the counter at either location first addresses the most significant byte, it causes the least significant byte to be transferred to a buffer 65. The buffer 65 is accessed when reading the counter register (TCRL) or alternate counter register (TARL) least significant byte, and thus completes a read sequence of the total counter value. The free running counter 55 can not be loaded or stopped by the program. When the free running counter overflows, an overflow detector 67 sets a timer overflow flag in a timer status register 69.

Each positive going edge of the square wave generated from the monitored analog voltage it is detected by an edge detector 71 which triggers an input capture register 73 (having bytes TICH and TICL) to read and store the count in the free running counter 55. The edge detector 71 also sets an input capture flag (ICF) in the timer status register 69. Thus, the input capture register 73 saves the count in the free running counter at each positive going edge of the filtered analog voltage.

As will be discussed below, the microprocessor 23 reads the count in the input capture register 73 through the internal processor bus 75. As will be discussed below, the microprocessor calculates from successive counts read from the input capture register 73 a precise count for an interrupt for generating the next voltage sample.

The timer 29 includes a 16-bit primary output compare register 77 (TOCH, TOCL), and a secondary output compare register 79 (TSCH, TSCL). The contents of the compare registers 77 and 79 are compared with the contents of the free running counter 55 in comparators 81 and 83, respectively. The comparator 81 and 83 set the primary output comparator flag (POCF) and secondary output comparator flag (SOCF) and the timer status register 69 when the respective compared values are equal.

An interrupt circuit 85 generates an interrupt request in response to the flags set in the timer status register 69. However, the interrupt circuit 85 will respond to the timer status register flags only if the corresponding interrupt is enabled by a timer control register 87. For instance, the interrupt circuit 85 will generate an interrupt in response to the primary output compare flag (POCF) only if it is enabled by the primary output compare interrupt enable bit (OCIE). Similarly, a secondary output compare flag (SOCF) will result in generation of an interrupt only if the secondary output compare interrupt enable bit (SCIE) is set. The input capture interrupt enable (ICIE) enables response to the (ICF) status flag. A timer overflow interrupt is generated when the TOF status flag is set, if the timer overflow interrupt enable bit (TOIE) is set. An input capture interrupt is enabled by the input capture interrupt enable bit (ICIE). An input edge polarity bit (IEDG) determines which level transition of the (TCAP) pin will trigger a free running counter transfer to the input capture register 73. A one selects the rising edge.

In accordance with the invention, the microprocessor 23 alternately selects the phase A voltage of the normal and the alternate source for frequency calculation and setting of the sampling interval. For example, when phase A of the normal source voltage is selected, the switch 35 (See FIG. 2) is closed and the square wave generated by the comparator 31 is applied to the timer 29. Once per cycle of the phase A voltage of the normal source, taken each time the square wave generated by the comparator 31 goes positive, the count in the free running counter 55 is captured in the input capture register 73. As this occurs once per cycle, the difference between successive counts of clock pulses represents the period of the monitored voltage signal; and of course, the inverse of the period is the frequency. The microprocessor then divides this count difference by an integer number representing the desired number of samples of a monitored voltage to be taken per cycle. The quotient represents the number of counts of clock pulses between samples. This interrupt count is added to the last count stored in the input capture register 73 and the sum is placed in the secondary output comparator register 79. When the count in the free running counter reaches the count stored in the secondary output comparator register, an interrupt is generated. This interrupt is applied to the A/D converter 25 which samples the normal source phase A voltage. The interrupt count is again added to the last count and placed in the secondary output comparator register 79 for generating the next sampling interrupt.

Figure 4:
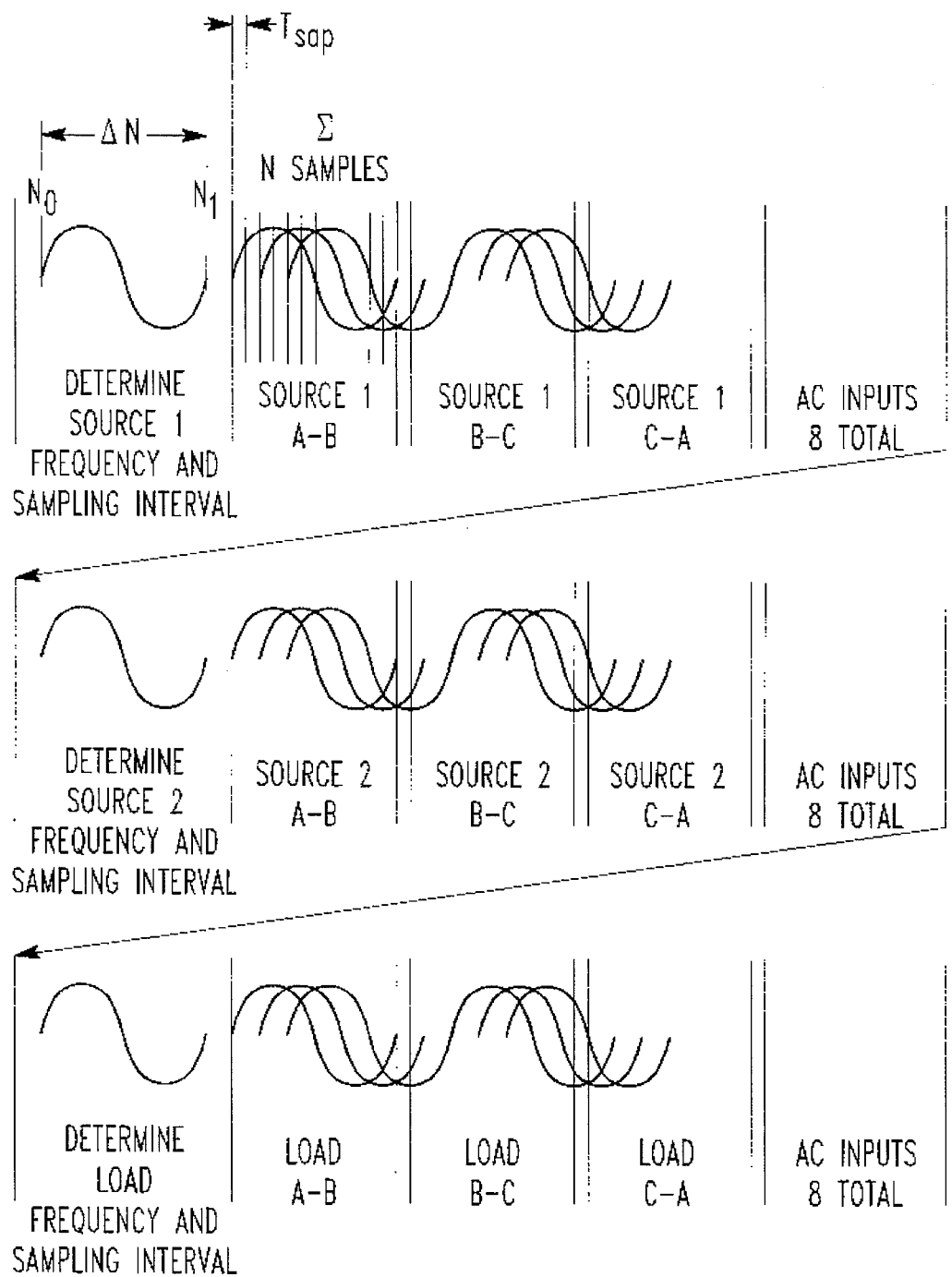
FIG. 4 is a diagram illustrating sequencing of sampling in accordance with the invention.

As shown in FIG. 4, the frequency in sampling interval for the first source, for instance, the normal source 3 is determined. As discussed above, this only requires one cycle of the source waveform. The calculated interval is then used to sequentially sample, for one cycle each, the source 1 A–B phase voltage, the B–C phase voltage, and the C–A phase voltage. Following this, the other ac inputs associated with the first source such as breaker open/close and normal/trip status. Next, a determination is made of the frequency and sampling interval for the second source. This is then followed sequentially by sampling the source 2 A–B phase voltage, the B–C source voltage, and C–A phase voltage of source 2. Again, the determination of the frequency and sampling interval, and the sequential sampling of each of the phase-to-phase voltages requires only one cycle each of the source 2 waveform. After the sampling of the source 2 phase-to-phase voltages, the ac inputs associated with the source 2, which are similar to those associated with source 1, are sampled for input to the digital processor.

Following this, the frequency in sampling interval for the load is determined if desired. While the frequency, and therefore the required sampling interval, for the load will be that of the connected source when the load is being powered, the frequency of the load voltage can be different from that of either of the sources, and in fact will be changing where the load is a motor which is coasting down after the interruption of power. Again the phase-to-phase voltages of the load are sequentially determined, and then the ac inputs from the load are sampled. This cycle of determining the frequency and sampling rate, and then sampling the phase-to-phase voltages and the ac inputs for the two sources (and the load if needed) is continuously repeated. If the load voltage frequency is to be determined separately, an additional phase A input circuit for the load voltage would be provided in FIG. 2.

As can be seen from above, the frequency and sampling rate are determined very rapidly, within one cycle. The large input filters 43 eliminate noise so that the period is accurately determined. As mentioned previously, the large filters 43 result in a large phase shift (approaching 90°) between the zero crossing of the phase A analog voltage and the square wave that is input to the digital processor for determining the cycles of the analog waveform. However, it is not necessary to know the precise instant of the zero crossings of the analog waveform in order to have precise, synchronous sampling of the waveform. The precise sampling interval is determined rapidly by the invention through the division of the count of clock pulses per cycle by the integer value of the number of samples per cycle desired. By synchronous sampling, it is meant that the sampling interval is divisible into the period of the waveform substantially exactly by an integer. Rarely will the integer be divisible precisely into the count; however, the resolution of the count is so high that the remainder is insignificant. The phase of the sampling relative to the phase of the ac signal does not matter.

Figure 5A:
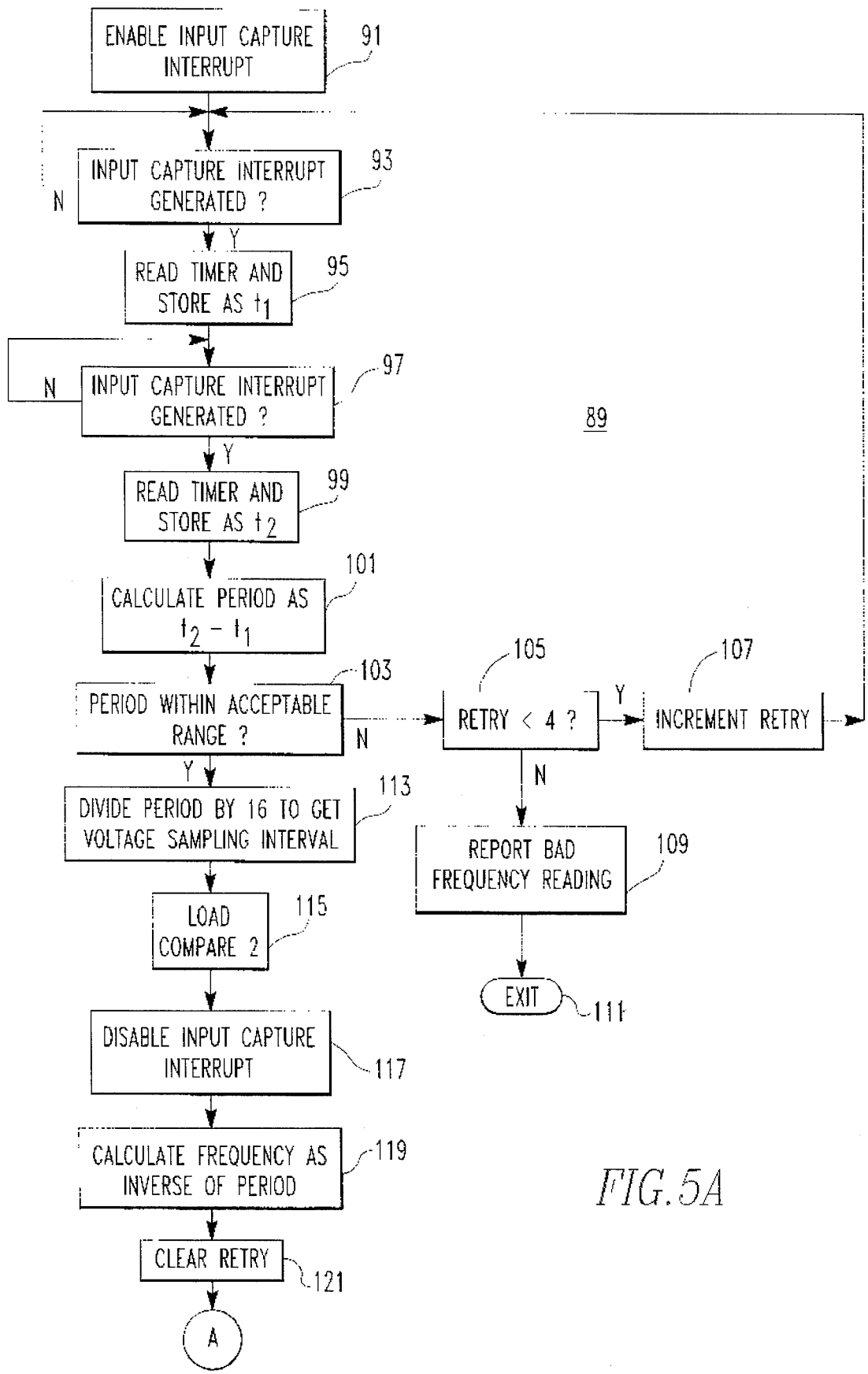
FIGS. 5A and 5B illustrate a flow chart of a suitable program utilized by the transfer switch control of FIGS. 2 and 3 to implement the invention.
Figure 5B:
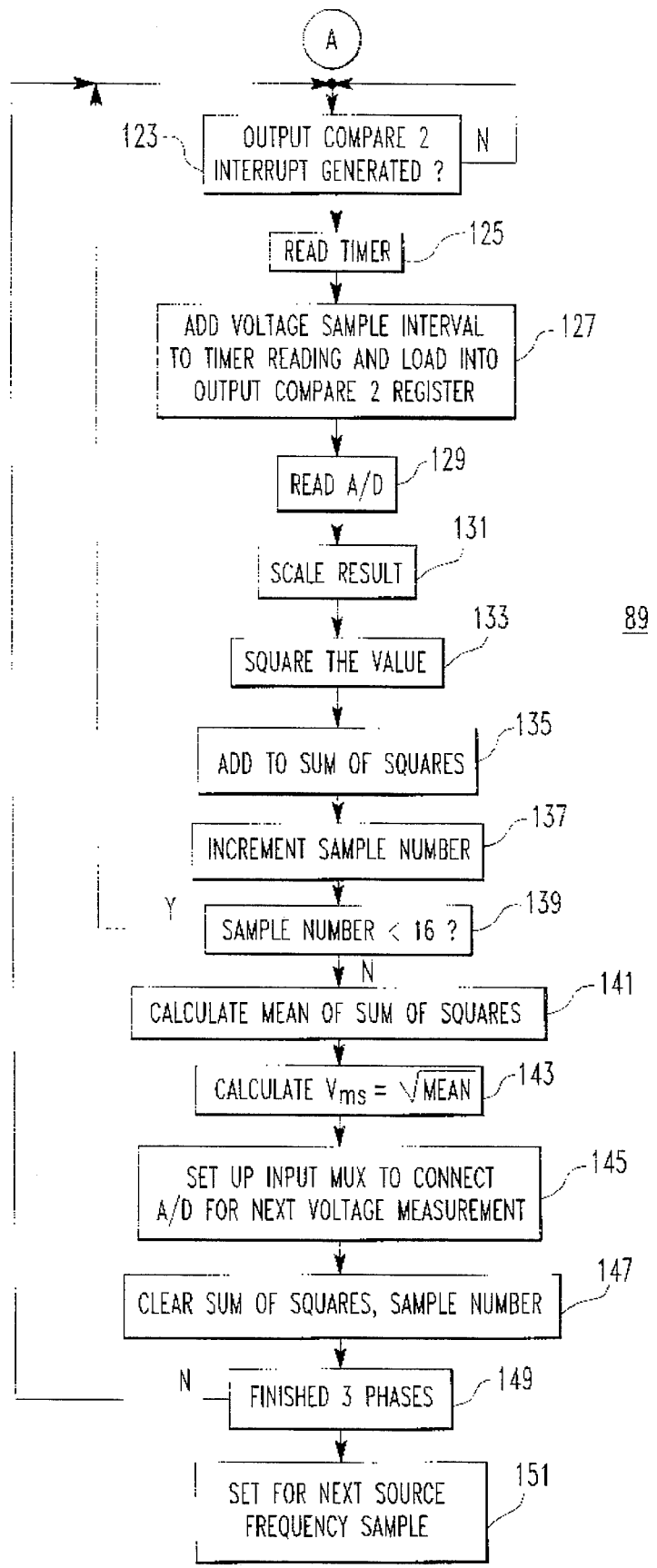

FIGS. 5A and 5B illustrate a flow chart of a program 89 suitable for use by the microprocessor 23 in carrying out the invention. With the input capture interrupt enabled (ICIE bit set) at 91, detection by the edge detector 71 of the rising edge of the selected source squared waveform generates an input capture interrupt at 93. In response to this interrupt, the microprocessor 23 reads the contents of the input capture register 73 and stores it as $t_1$ at 95. Upon the occurrence of the next input capture interrupt at 97, the microprocessor 23 reads the input capture register 73 again at 99 and stores the value as $t_2$ at 99. The difference between the counts $t_2$ and $t_1$ is used to calculate the period of the analog signal at 101. If the period is not within an acceptable range, which represents a frequency from about 40 to 80 Hz, the above sequence is repeated at 105 and 107. If four retries fail to result in a period within the acceptable range, a bad frequency reading is reported at 109 and the program is exited at 111.

Normally, the period will be within an acceptable range at 103, and the difference count between $t_1$ and $t_2$ is then divided by the desired sampling rate, which in the exemplary embodiment of the invention is 16 samples per cycle, to determine the voltage sampling interval count at 113. This sampling count is then added to the count $t_2$ and loaded into the secondary output compare register 79 at 115. Next, the input capture interrupt is disabled at 117, the frequency is calculated as the inverse of the period at 119, and the retry count is cleared at 121.

The program 89 then enters the loop shown in FIG. 5B for sampling the phase voltages of the selected source. Thus, when the count in the free running counter 55 reaches the interrupt count stored in the secondary output compare register 79, as indicated at 123, the microprocessor 23 reads the running count at 125. As will be recalled, generation of this interrupt will trigger the A/D converter 25 to sample the selected analog signal. The microprocessor 23 adds the sample count (interval) to the timer reading to generate the next interrupt time which is loaded into the secondary output compare register 79 at 127. The microprocessor then reads the A/D converter at 129, scales the results at 131, squares the value at 133 and adds this to the sum of squares at 135 for use in calculating the RMS value of the sampled waveform. The sample number is then incremented at 137, and additional samples are generated until 16 samples have been gathered at 139. When a full cycle of samples have been gathered, the mean of the sum of squares is calculated at 141. The RMS value of the waveform is then calculated as the square root of this mean value at 143. The multiplexer 39 is then set up to connect the A/D converter 25 for input of the next phase-to-phase voltage measurement at 145 and the registers are cleared at 147 for the new calculation. When all three phase-to-phase voltages have been input at 149, the program is set up for determining the frequency and sampling interval (count), and for carrying out the sampling of the waveforms for the next source at 151.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. Apparatus for digitizing ac signals from multiple sources each of which may be of unknown or varying frequency, said apparatus comprising:

selection means for alternatively selecting one of said multiple ac signals;

input circuit means generating an input pulse for each cycle of said one ac signal;

clock signal generating means generating a digital clock signal comprising clock pulses;

counter means to which said digital clock signal is applied to generate a running count of said clock pulses;

digital means having means responsive to said input circuit means for determining a difference count of clock pulses generated by said counter means between consecutive input pulses, sampling count generating means dividing said difference count of clock pulses by a sampling factor equal to a desired number of samples of said one ac signal to be taken per cycle of said one ac signal to generate a sampling count, and sampling interrupt generating means for generating a sampling interrupt signal for each sampling count of clock pulses; and analog to digital converter means generating a digital sample of said one ac signal in response to each sampling interrupt signal.

2. The apparatus of claim 1 wherein said selection means sequentially selects said multiple ac signals as said one ac signal, and said digital means calculates a separate sampling count and generates a separate sampling interrupt for each of said multiple ac signals selected as said one ac signal.

3. The apparatus of claim 2 wherein each of said multiple ac signals is a multi-phase signal and wherein said separate sampling count is used by said analog to digital converter means for each phase of each selected one of said multiple ac signals.

4. Apparatus for digitizing an ac signal of unknown or changing frequency, comprising:

input circuit means generating an input pulse for each cycle of said ac signal;

clock signal generating means generating a digital clock signal comprising clock pulses;

counter means to which said digital clock signal is applied to generate a running count of said clock pulses;

digital means having means responsive to said input circuit means for determining a difference count of clock pulses counted by said counter means between first and second selected input pulses, sampling count generating means dividing said difference count of clock pulses by a sampling factor selected to produce a desired number of samples of said ac signal to be taken per cycle of said ac signal to generate a sampling count, and sampling interrupt generating means for generating a sampling interrupt signal for each sampling count of clock pulses; and analog to digital (A/D) converter means generating a digital sample of said ac signal in response to each sampling interrupt signal.

5. The apparatus of claim 4 wherein said first and second selected input pulses are consecutive input pulses, and said sampling factor is equal to an integer number of samples to be taken per cycle.

6. The apparatus of claim 5 wherein said means responsive to said input circuit means for determining said difference count comprises means storing said running count of clock pulses at each input pulse to generate stored values of said clock pulses and means subtracting consecutive stored values of said clock pulses to generate said difference signal.

7. The apparatus of claim 5 wherein said sampling interrupt generating means comprises means for repetitively reading said running count of clock pulses to generate a current running count, and for adding said sampling count to said current running count to generate an interrupt count, and means comparing said interrupt count to said running count of clock pulses and generating said sampling interrupt signal when said running count of clock pulses equals said interrupt count.

8. The apparatus of claim 4, wherein said ac signal is a multiphase ac signal, wherein said A/D converter means generates said desired number of samples sequentially for each of said multiple phases of said ac signal in response to said sampling interrupt signal.

9. The apparatus of claim 8 wherein said sampling count generating means generates said sampling count from the count in said counter means in response to two consecutive input pulses and does not change said sampling count until said desired number of samples have been generated sequentially for each of said multiple phases.

* * * * *